United States Patent [19]
Garmong

[11] Patent Number: 5,749,178
[45] Date of Patent: May 12, 1998

[54] SHIELDED ENCLOSURE

[76] Inventor: Victor H. Garmong, R.D. #1, Kennerdell, Pa. 16374

[21] Appl. No.: 689,340

[22] Filed: Aug. 6, 1996

[51] Int. Cl.[6] .................................................. E04H 1/00
[52] U.S. Cl. ...................... 52/79.1; 174/35 MS; 174/35 R
[58] Field of Search ................... 52/79.1, 309.4, 52/309.9, 302.1, 302.3; 174/35 MS, 35 R

[56] References Cited

U.S. PATENT DOCUMENTS

| | | |
|---|---|---|
| 4,651,099 | 3/1987 | Vinegar et al. . |
| 4,755,630 | 7/1988 | Smith et al. . |
| 4,806,703 | 2/1989 | Sims . |
| 5,401,901 | 3/1995 | Gerry et al. ................ 174/35 MS |
| 5,452,550 | 9/1995 | Vanesky et al. ............ 174/35 WS X |
| 5,487,247 | 1/1996 | Pigg ............................. 52/302.1 X |
| 5,522,194 | 6/1996 | Graulich ...................... 52/309.4 |
| 5,545,844 | 8/1996 | Plummer, III et al. ...... 174/35 MS |
| 5,603,196 | 2/1997 | Sohlstrom .................... 174/35 MS X |

OTHER PUBLICATIONS

Lightning/EMP Catalog, PolyPhaser Corporation, Oct. 20, 1995.
Striking News from PolyPhaser, PolyPhaser Corporation, Nov. 1995.
A portion of a booklet concerning shielding published by Westinghouse Electric Co., publication date unknown.

*Primary Examiner*—Creighton Smith
*Attorney, Agent, or Firm*—Kirkpatrick & Lockhart LLP

[57] ABSTRACT

Apparatus for protecting a plurality of electrical components. In a preferred embodiment, the apparatus comprises a shell formed from an electrically conductive material. An access door is provided in the shell for selectively gaining access to the electrical components. The shell is equipped with grounding apparatus for conducting electrical current created when a lightning strike communicates therewith to a ground. The shell is also equipped with a magnetic shield for substantially shielding the plurality of electrical components from electromagnetic fields created in the shell as a result of electrical current passing therethrough.

14 Claims, 6 Drawing Sheets

FIG. 7

SHIELDED ENCLOSURE

FIELD OF THE INVENTION

The present invention relates to shielded enclosures and, more particularly, is directed to enclosures for protecting electronic equipment from damage from electromagnetic fields created by lightning strikes.

DESCRIPTION OF THE INVENTION BACKGROUND

Perhaps when one thinks of the discovery of electricity, various depictions of Benjamin Franklin flying his infamous kite in a lightning storm come to mind. While history is somewhat ambiguous as to exactly what role Franklin's observation of lightning played in the discovery of electricity and the subsequent invention of the myriad of electronic devices that we use in our every day life, man still struggles to harness and control its power.

A lightning strike starts with a "local" electrical breakdown of the atmosphere. Typically, the lightning "steps down" toward the earth about 150 feet in one micro-second time increments every 49 micro-seconds. During each of the 49 micro-second dormant stages, an imaginary hemisphere having a radius of 150 feet can be used to determine the next jumping distance. Any object such as a tower, building, tree, etc. which penetrates this hemisphere, can be chosen as the point of attachment for the return stroke (i.e., the lightning strike).

When lighting strikes an object, it generally takes the path of least resistance to the ground and, if that path happens to lead through a circuit that includes electrical/electronic components incapable of accommodating such a surge of electrical current, those components may be damaged or destroyed. For example, many people have had electrical devices such as televisions, VCRs, computers, etc. damaged by a lightning strike or probably know someone that has experienced such damage.

Over the years, a variety of different devices and methods have been developed to prevent electrical component damage caused by a lightning strike. Examples of such devices are fuses, circuit breakers, surge protectors, etc. Another device commonly used to protect electronic equipment from lightning strike damage is known as a lightning arrester which reduces excessive voltage resulting from lightning to a safe level by "grounding" the discharge.

"Ground" is the term used to describe the common connection in an electrical or electronic circuit. The common connection for electronic circuits is almost always ultimately routed to the earth. The earth is a fair to good conductor of electricity depending upon the characteristics of the soil. A ground connection is the electrical contact between the common point of an electrical or electronic system and the earth. Effective grounding systems typically include one or more ground rods driven into the soil to a depth of 6 to 8 feet. Other common grounding methods involve establishing a ground connection with a structure's cold water pipe. Thus, some circuit protection apparatuses and methods serve to provide a deliberate and controlled path for the electrical energy resulting from a lightning strike to return to ground.

While the above-mentioned apparatuses and practices serve to protect electrical components from surges of electrical energy caused by lightning strikes, lightning can cause other problems which require different solutions. For example, as the electromagnetic field, created by a "nearby" lightening strike passes through electrical/electronic components, voltages and/or currents are generated that may cause permanent damage to the components. In the past, to protect electrical/electronic components from such damage, each individual component was housed within its own enclosure fabricated from a material that is capable of attenuating electromagnetic effects by providing a low-reluctance path for magnetic lines of force and a closed conductive shell for electric lines of force. Because such material can be relatively expensive, the ability to protect numerous components with their own individual enclosures can be cost prohibitive. Also, in some cases, a single shield will reach saturation magnetization because of high-flux density magnetic fields, which reduces the effectiveness of the shield. That problem has been addressed by increasing the thickness of the shield material or by nesting a number of thinner shields together. Either method, however, can be very expensive when numerous electrical/electronic components must be shielded.

Perhaps the industry that has been most plagued with problems associated with lightning strikes is the natural gas industry. Today, the natural gas industry typically utilizes very sophisticated electronic equipment for monitoring and recording the output of gas wells and the purchase and resale of natural gas in the transmission and distribution systems. Usually such equipment is housed within an enclosure or building at the well site or pipeline. In remote locations, such equipment may communicate, via satellite, with computers and other equipment located at the gas company's offices.

In the past, gas companies have enclosed their gas well and pipeline equipment in makeshift buildings fabricated from various materials such as, for example, fiberglass, plastic, cement blocks, corrugated steel, etc. All of those materials generally have poor grounding capabilities in addition to various other shortcomings. For example, while buildings and enclosures fabricated from plastic and/or fiberglass do not experience corrosion problems and are generally easy to erect and transport, they are susceptible to pest and vermin damage. Such enclosures also fail to shield equipment from electromagnetic fields. Likewise, while enclosures fabricated from concrete blocks are generally impervious to vermin and pests, they are difficult to transport and usually must be constructed on site. Such buildings also offer little protection from electromagnetic fields. Enclosures and buildings fabricated from corrugated steel are generally easy to erect, but are susceptible to corrosion and vermin damage while providing little protection from electromagnetic fields.

The problems associated with lightning strikes and the electrical/electronic component damage caused by the electrical and magnetic energy created thereby are not unique to the natural gas industry, however. These problems are encountered in a variety of other industries and applications where electrical/electronic components are susceptible to lightning damage.

Accordingly, there is a need for an enclosure for housing electrical/electronic components that protects the components from electrical and magnetic effects resulting from lightning strikes or any other electromagnetic field generator.

There is also a need for such an enclosure that can be easily installed at a remote location that is also corrosion and vermin resistant.

SUMMARY OF THE INVENTION

In accordance with the particular preferred form of the present invention, there is provided an apparatus for protecting a plurality of electrical components which, in preferred form, comprises a shell member fabricated from a first electrically conductive material that functions as a closed gaussian surface. The shell member defines an interior space for enclosing the plurality of electrical components therein. An access door is provided in the shell member and is selectively movable between an open position wherein the plurality of electrical components can be accessed and a closed position wherein the door cooperates with the shell member to substantially completely enclose the plurality of electrical components therein. Grounding apparatus is attached to the shell member for conducting electrical current caused by lightning striking the shell to a ground. The apparatus further comprises an electromagnetic shield assembly attached to the shell member for substantially shielding the plurality of electrical components from electromagnetic fields created in the first material when a lightning strike communicates with the shell or other external fields.

Accordingly, the present invention provides solutions to the aforementioned problems associated with protecting electrical components from damage caused by lighting strikes. The present invention provides an enclosure that can be fabricated in a variety of shapes and sizes suited to the particular application. For example, the present invention could range in size from a relatively small enclosure sized to house and protect a plurality of small electrical components, to a building large enough to support computers, transmitters, recorders, valves, etc. The present invention is also particularly well-suited for use at remote locations such as gas wells, pipelines and the like where the enclosure may be subjected to insects and vermin. The subject invention is also easier to transport to remote locations than prior enclosure arrangements and is corrosion resistant. However, these and other details, objects and advantages will become apparent as the following detailed description of the present preferred embodiment thereof proceeds.

BRIEF DESCRIPTION OF THE DRAWINGS

In the accompanying drawings, there are shown present preferred embodiments of the invention wherein like reference numerals are employed to designate like parts and wherein.

DETAILED DESCRIPTION OF THE PREFERRED EMBODIMENTS

Referring now to the drawings for the purposes of illustrating the present preferred embodiments of the invention only and not for purposes of limiting the same, the Figures show a building enclosure generally designated as 10 adapted to house electrical equipment therein. As used herein, the phrase "electrical equipment" also encompasses electronic equipment. While this present preferred embodiment is well adapted for housing electrical equipment located at remote locations such as natural gas wells, the skilled artisan will readily appreciate that the novel features of this embodiment can be employed to protect/shield a variety of different electrical components regardless of their location and application. Thus, the scope of protection afforded to the subject invention should not be limited to enclosures for protecting/housing electrical equipment located at natural gas wells and pipelines.

Figure 1:
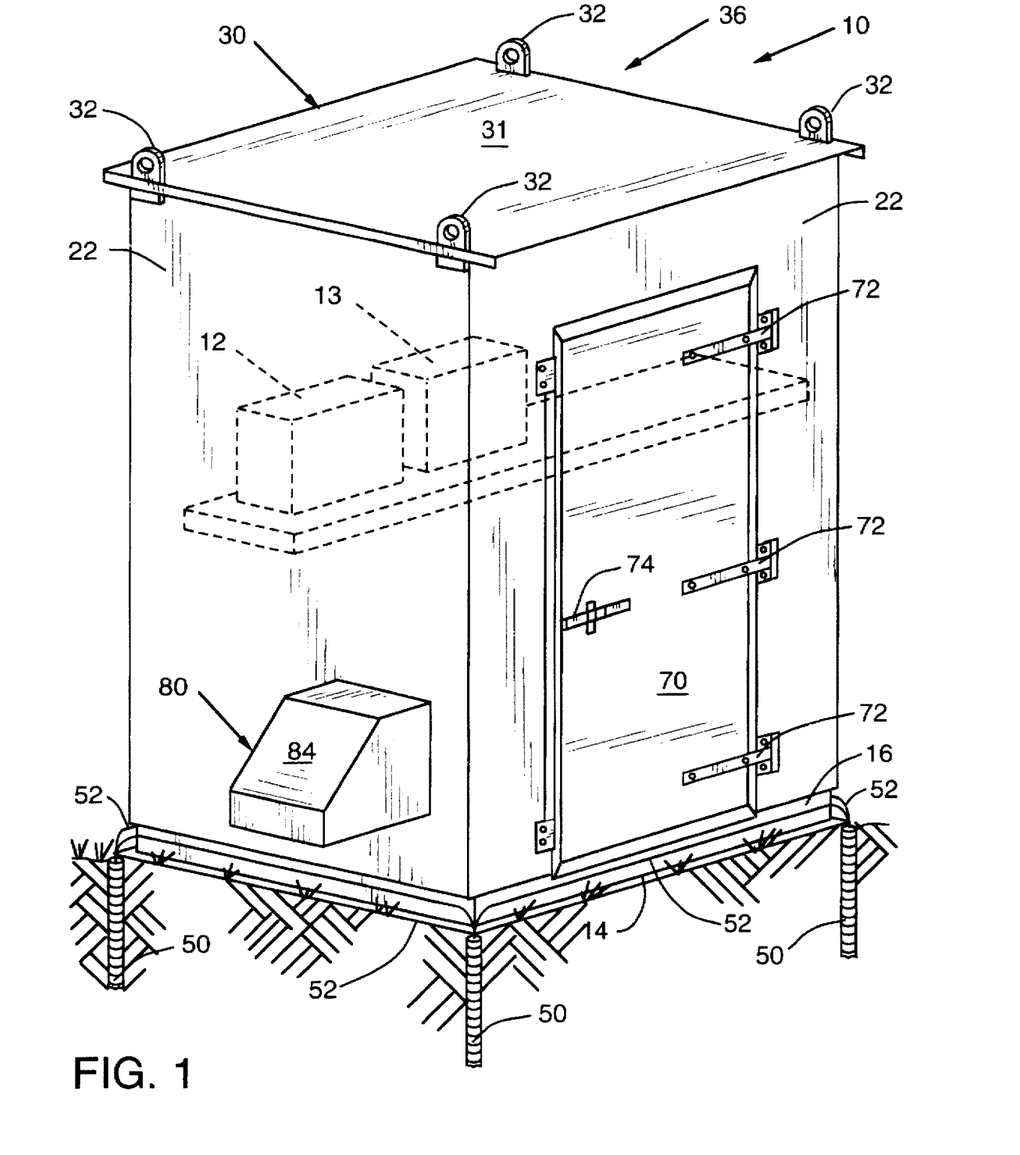
FIG. 1 is a perspective view of a preferred building enclosure of the present invention.

More particularly and with reference to FIG. 1, there is shown an enclosure 10 that houses a plurality of electrical equipment, represented by elements 12 and 13. Such electrical equipment could comprise, for example, computers, transmitters, electronic meters, recorders, receivers, etc. In a preferred embodiment, the enclosure 10 includes a bottom frame member 14 that is preferably fabricated from aluminum I-beams 16 welded together. See FIGS. 1 and 2. The floor 20 of the enclosure 10 preferably comprises a piece of commercially available "diamond plate" 21 fabricated from aluminum that is welded to the frame member 14. The enclosure 10 also includes four side members 22, preferably fabricated from aluminum plate, that are welded together at their edges and are welded to the frame 14. To provide support for the side members 22 and a roof assembly 30, upwardly extending support members 24, preferably fabricated from square or rectangular aluminum tubing, are attached to the floor plate 21. See FIG. 4. A preferred support arrangement comprises a support member 24 at each corner and at least one support member 24 corresponding to each side 22. However, it is conceivable that, depending upon the size and shape of the enclosure 10, the support members 24 can be omitted or other support member arrangements could be successfully employed. The roof assembly 30, preferably comprises an aluminum plate 31 that is welded to the sides 22 and upwardly extending support members 24 to complete the enclosure 10. To assist with the transportation and installation of the enclosure, four crane loop members 32 are welded to the roof plate 31 to enable the enclosure to be manipulated by a crane or other handling device in a known manner. The skilled artisan will appreciate that the above-mentioned structure (i.e., frame, support members, walls, floor, and roof) comprises the "shell" 36 of the enclosure.

The enclosure 10 depicted in FIGS. 1-4 is rectangular in shape and is preferably fabricated from a plurality of building members comprising aluminum plate and tubing that are welded together. The skilled artisan will appreciate that the enclosure 10 can be provided in a variety of different shapes and sizes and can be fabricated from various electrically conductive materials. For example, the enclosure could be fabricated from a piece of cylindrical tubing made from stainless steel. Thus, the scope of protection afforded to the present invention should not be limited to rectangular-shaped enclosures fabricated from a plurality of aluminum plates that are welded together.

Figure 4:
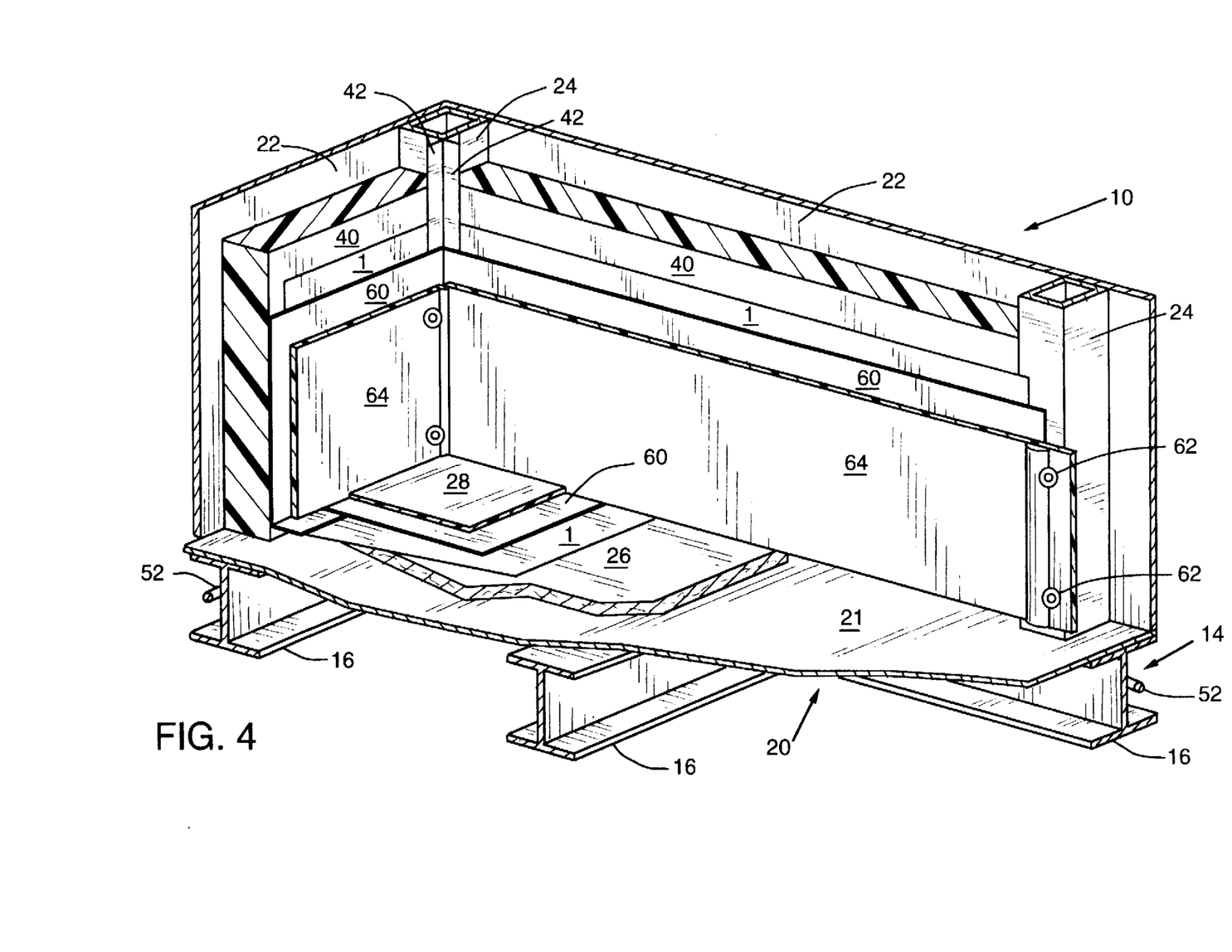
FIG. 4 is a partial perspective view of a portion of the building enclosure of FIGS. 1-3 showing the elements thereof in cross-section.
Figure 5:
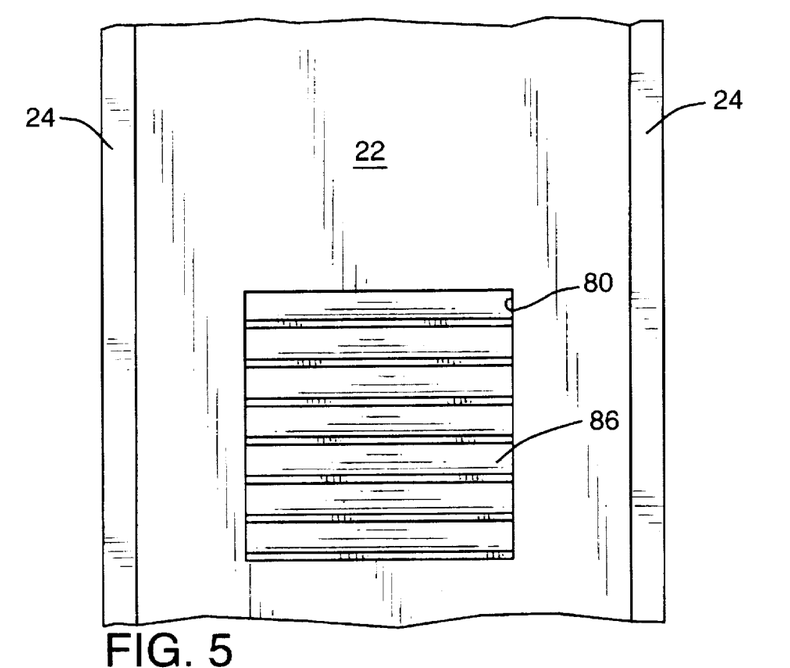
FIG. 5 is an interior elevational view of a preferred vent arrangement of the present invention.
Figure 6:
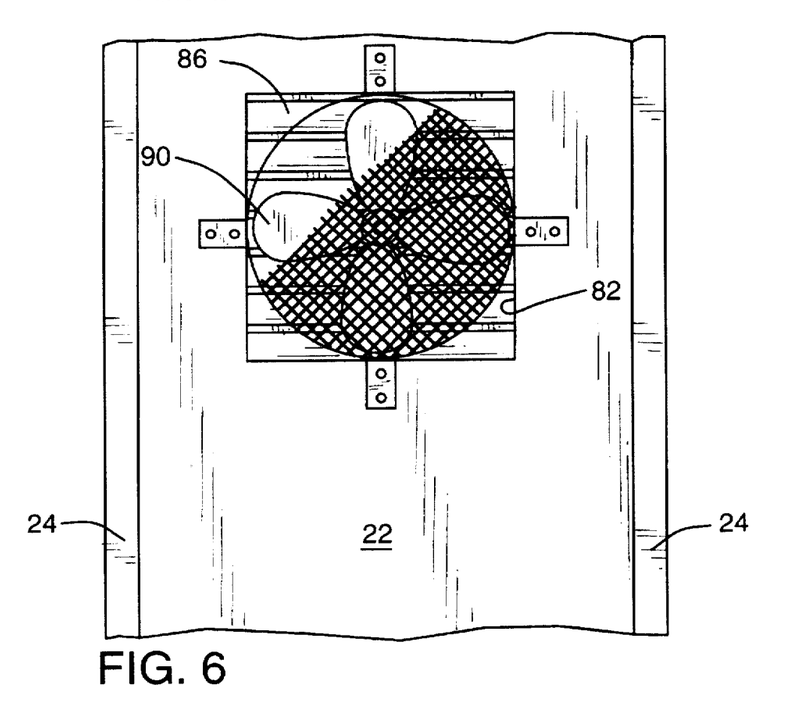
FIG. 6 is an interior elevational view of a preferred vent/fan arrangement of the present invention.

FIG. 4 illustrates a preferred wall and floor construction of the present invention. As can be seen in that Figure, commercially available thermal insulation 40 is preferably installed between the support members 24. Preferably, foam insulation is glued to the inside surface of each wall member 22; however, other types of commercially available insulation may be successfully used. Roof assembly 30 may be similarly insulated; however, such insulation can be omitted if desired. In a preferred embodiment, to provide additional support to the insulation 40 and other materials, aluminum angles 42 are tack welded to the support members 24 as shown in FIG. 4.

As discussed above, the outer wall(s) 22 of the enclosure 10 are preferably fabricated from an electrically conductive material such that when a lightning strike hits or otherwise communicates with the enclosure 10, the shell 36 provides a path for the electric current to safely reach ground. Preferably, a commercially available grounding rod 50 (preferably 5'–6' long) is inserted into the earth near each corner of the shell 36. Each grounding rod 50 is connected to the corresponding corner of the shell 36 by a copper wire 52 or other suitable conductor that also serves to electrically connect the grounding rods 50 together. Thus, when the shell 36 conducts electrical current from a lightning strike, the energy passes through the conductor 52 to the grounding rods 50 to the earth to "ground" the enclosure 10. The skilled artisan will, of course, appreciate that the number, size, composition of grounding rods 50 and even the grounding method employed could vary depending upon the type, size, shape, composition, etc. of the enclosure.

The skilled artisan will appreciate that electrical current is conducted through the shell 36 to ground. This movement of charged particles in the interior of the shell 36 creates a magnetic force defined by a magnetic vector field. The contribution to that field due to a differential current element is perpendicular to the velocity of that element and the divergence of the magnetic induction field is zero. The total force produced, known as the "Lorentz Force", is the result of the total electromagnetic field present and contains electric and magnetic components. Thus, in a preferred embodiment, a magnetic shield assembly 60 is employed to protect the electrical equipment (12, 13) housed within the enclosure from damage by the electromagnetic forces.

More particularly and with reference to FIG. 4, the shell 36 of the enclosure is preferably completely lined with a ferromagnetic material 60 that has low reluctance. Nickel-iron alloys typically have acceptable reluctances and high magnetic permeabilities. Preferably, material 60 comprises a 0.015–0.06" thick plate fabricated from the alloy fabricated and sold by Carpenter Technology Corporation of Reading, Pa., under the trademark Hipernom®. The Hipernom® alloy is a soft magnetic alloy containing approximately 80% nickel, 4.20% molybdenum, and 15% iron which develops extremely high permeabilities with minimum hysteresis loss. While a preferred alloy contains about eighty percent nickel, other alloys comprising about forty to about eighty percent nickel can also be successfully used.

As can be seen in FIG. 4, the magnetic shield material 60 is attached to the support members 24 by mechanical fasteners 62 (i.e., rivets, screws, etc.) of a conducting type material which will ground the shielding material to the aluminum or outer shell so that both enclosures remain at ground potential. In a preferred embodiment, a moisture resistant wall board 64 is placed over the magnetic shield assembly 60 and retained in position by fasteners 62. The roof assembly 30 of the enclosure is preferably similarly constructed.

The present invention is also preferably provided with an access means that comprises a door in one of the walls 22. The door 70 of the enclosure is also preferably fabricated from the material comprising the shell 36 and shielding material with a plywood core and is attached thereto by a collection of hinges 72 and a latch 74 that are fabricated from the shell material or, for example, stainless steel. In a preferred embodiment, the hinges 72 and latch 74 are attached to the door 70 and shell 36 by stainless steel screws.

Also, in a preferred embodiment, the door 70 is constructed using known construction techniques such that a seal is achieved between the corresponding wall 22 and the door 70 that is substantially impervious to vermin and insects.

The floor plate 21 of the enclosure 10 is preferably covered with a non-conductive material 26 such as plywood or particle board and the magnetic shield material 60 is placed over the board 26. In a preferred embodiment, commercially available floor tile 28 is installed over the magnetic shield material 60. The plywood/magnetic shield/floor tile assembly is preferably attached to the floor plate by a commercially available adhesive material.

In a preferred embodiment, because the material comprising the shell 36 of the building (i.e., aluminum) differs in composition from the magnetic shield material 60, a corrosion prevention means 1, such as, a rubber or polymeric material is inserted between those two materials to prevent galvanic corrosion from occurring. The skilled artisan will appreciate that other corrosion prevention methods may also be employed. For example, the magnetic shield material 60 or the aluminum may be coated with a polymeric or other corrosion/insulating material that would prevent galvanic corrosion from occurring.

Figure 2:
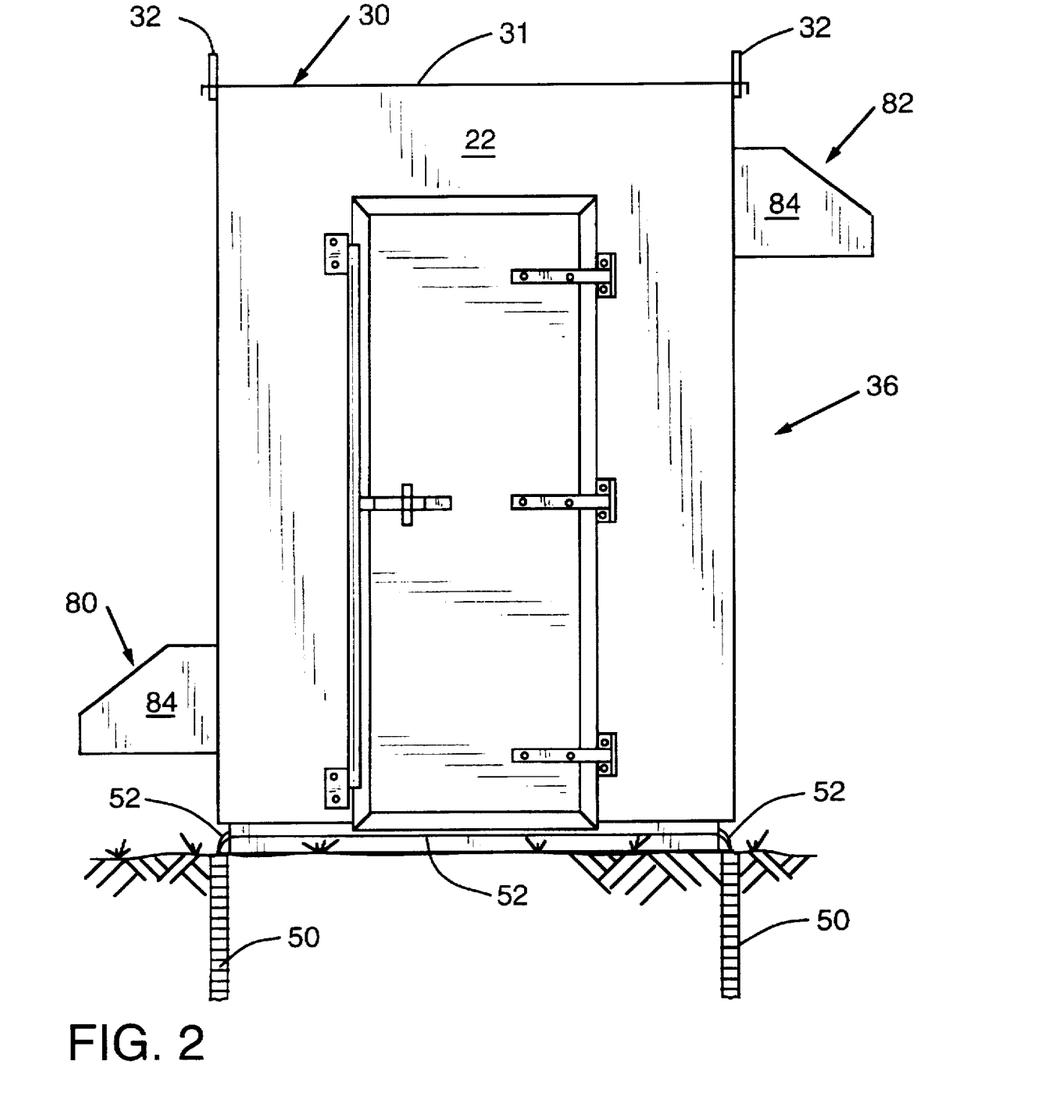
FIG. 2 is a front elevational view of the building enclosure of FIG. 1.
Figure 3:
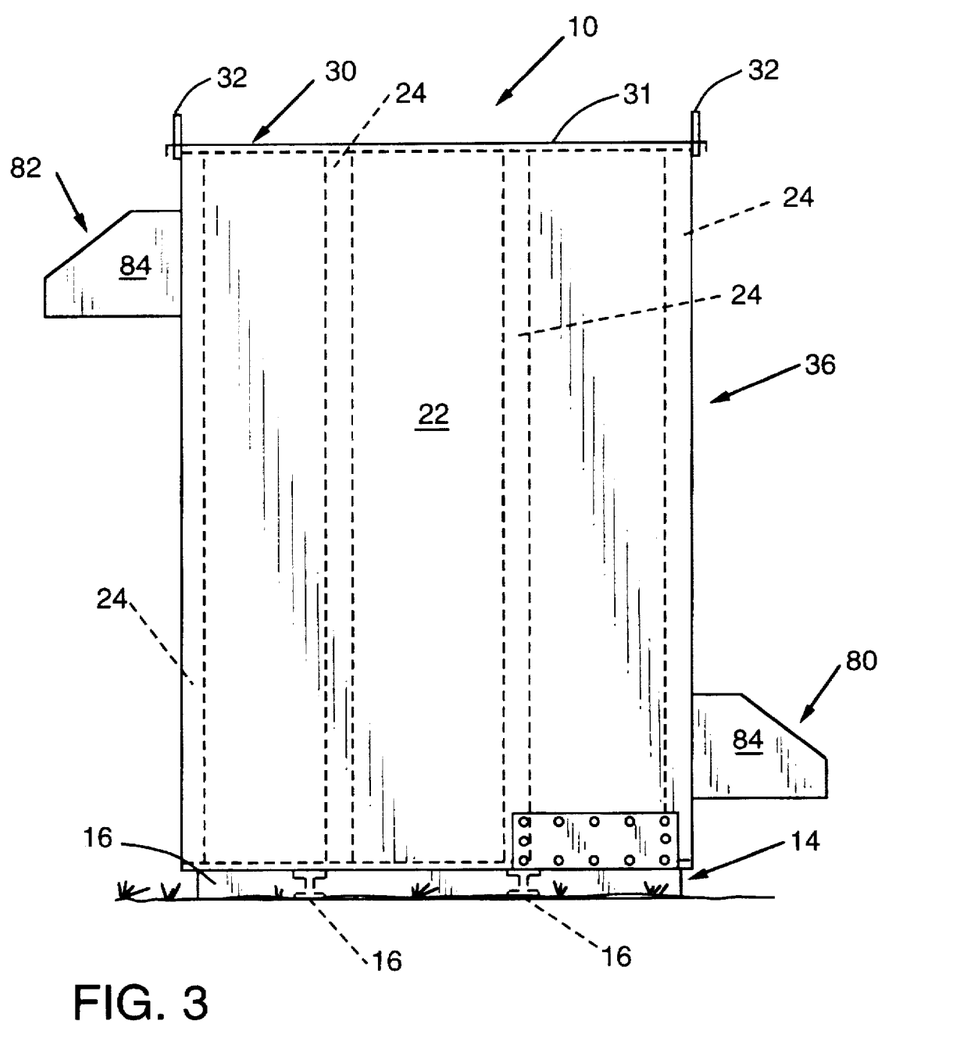
FIG. 3 is a rear elevational view of the building enclosure of FIGS. 1 and 2.

In environments wherein the enclosure 10 may encounter warm temperatures that could hamper the functioning of the electronic components therein, at least one, and preferably two, vents (80, 82) are provided through corresponding walls 22 of the enclosure 10 to permit outside air to be circulated through the enclosure to control the temperature therein. As can be seen in FIGS. 2 and 3, a first vent 80 is provided in one wall 22 adjacent the bottom of the enclosure. A second vent 82 is provided in an opposing wall 22 near the roof assembly 30 of the enclosure 10. Each vent (80, 82) has an exterior housing member 84 fabricated from the same material comprising the shell 36 (i.e., aluminum). Each vent (80, 82) also preferably is equipped with louvers 86 that are also fabricated from the shell material. These louvers 86 can be operated by a thermostat-controlled motor (not shown) which serves to open and close the louvers 86 based on the temperature within the enclosure.

To establish air flow through the enclosure, vent 82 is preferably equipped with an electrically powered fan 90. In a preferred embodiment, the fan motor is controlled by a thermostat-equipped switch (not shown). Fan 90 is also preferably provided with a guard 92 that is fabricated from expanded metal. In a preferred embodiment, guard 92 is fabricated from magnetic shield material 60. The skilled artisan will also appreciate that the subject building may be equipped with lights, shelving, air conditioning etc.

Figure 7:
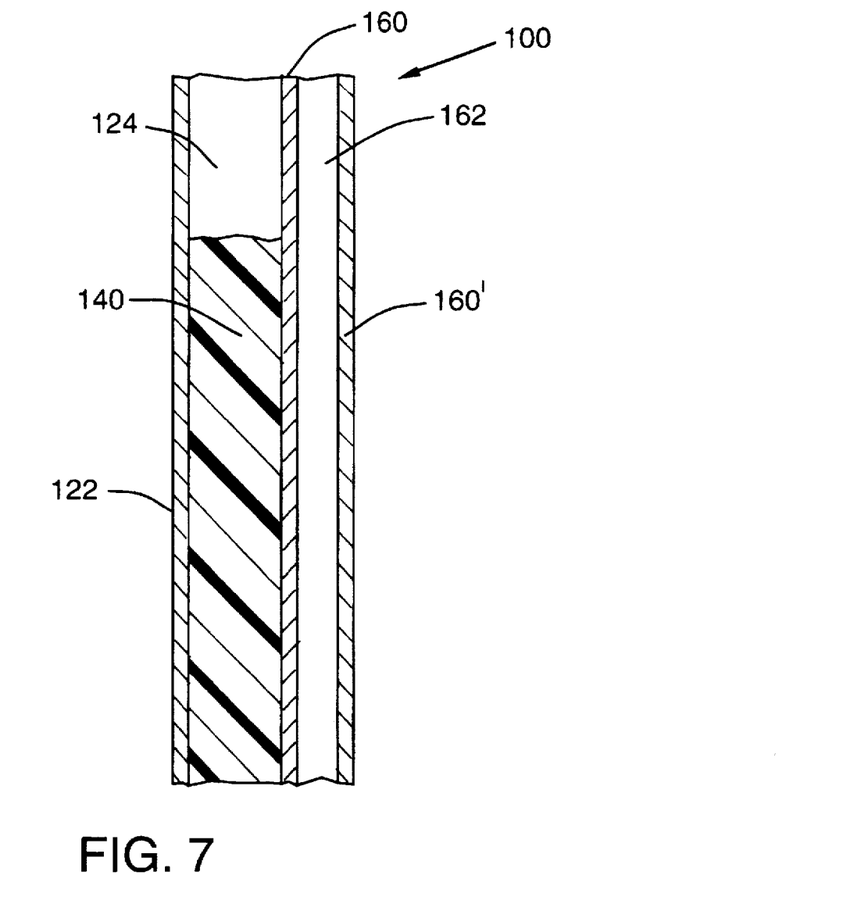
FIG. 7 is a partial cross-sectional view of another preferred wall configuration of the present invention.

In environments wherein the enclosure may be exposed to other external sources of electromagnetic forces such as, for example, high-tension wires or large electric motors, the skilled artisan will appreciate that a plurality of magnetic shields may be employed in a nested arrangement to attenuate such forces. For example, a preferred wall cross-section of an enclosure 100 that employs nested magnetic shields is depicted in FIG. 7. As can be seen in that Figure, the wall includes a side member 122 (preferably fabricated from aluminum or stainless steel that is grounded in a suitable manner), a first magnetic shield 160 and a second inner magnetic shield 160'. Preferably, the first magnetic shield 160 is attached to frame support members 124 in a spaced-apart relationship with respect to the adjacent side members 122. A thermal insulation 140 is preferably provided in the airspace. Those of ordinary skill in the art will also appreciate that the number of nested shells and the air spaces therebetween can vary depending upon the strength of the electromagnetic force and the reluctance of each shield.

Accordingly, the present invention provides solutions to the aforementioned problems associated with protecting electrical components from damage caused by lightning strikes. The present invention also provides a means for protecting a plurality of electrical components located at a remote site from lightning damage, corrosion, insect and vermin damage, etc. It will be understood, however, that various changes in the details, materials and arrangements of parts which have been herein described and illustrated in order to explain the nature of the invention may be made by those skilled in the art within the principle and scope of the invention as expressed in the appended claims.

What is claimed is:

1. Apparatus for protecting a plurality of electrical components, comprising:
   a shell member fabricated from a first electrically conductive material, having an interior surface and defining an interior space for enclosing said plurality of electrical components therein;
   grounding means attached to said shell member for conducting electrical current created when a lightning strike communicates with said shell member to a ground; and
   a non-laminated magnetic shield means, comprising a second material, attached to said interior surface of said first material in a spaced relationship to create a space therebetween for receiving a thermal insulating material therein, and adapted to substantially attenuate an electromagnetic field created inside the shell of said first material when said lightning strike communicates with said shell member and to substantially shield said plurality of electrical components from electromagnetic fields created in said first material when said lightning strike communicates with said shell member.

2. The apparatus of claim 1, wherein said magnetic shield means comprises at least one other magnetic shield means nested therein.

3. The apparatus of claim 1 further comprising access means in said shell member selectively movable between an open position wherein said plurality of said electrical components can be accessed and a closed position wherein said access means cooperates with said shell member to substantially completely enclose said plurality of electrical components therein.

4. The apparatus of claim 1 further comprising a corrosion prevention means located between said first and second materials.

5. The apparatus of claim 1 wherein said first material is aluminum and said second material is an alloy comprising about forty to about eighty percent nickel.

6. The apparatus of claim 1 further comprising vent means in said shell member and said magnetic shield means for selectively providing ventilation to said interior of said shell member.

7. The apparatus of claim 6 wherein said vent means further comprises at least one fan member corresponding to at least one vent means for drawing air into said shell member.

8. The apparatus of claim 7 wherein each said fan member has a corresponding guard means fabricated from a material adapted to substantially attenuate said magnetic fields.

9. A building for protecting a plurality of electrical components, comprising:
   a plurality of building members fabricated from a first electrically conductive material, said building members being welded together to form a shell for housing said electrical components therein;
   a door member in said shell, said door member fabricated from said first material and being selectively openable and closeable such that when said door member is closed, said door member cooperates with said shell to substantially completely enclose said plurality of electrical components therein;
   grounding means attached to said shell for conducting electrical current created by a lightning strike to a ground; and
   a non-laminated magnetic shield means attached to said shell and said door member for substantially shielding said plurality of electrical components from electromagnetic fields created in said shell when said lightning strike communicates therewith
   vent means in said shell member and said magnetic shield means for selectively providing ventilation to said interior of said building, comprising guard means fabricated from a material adapted to substantially attenuate said electromagnetic fields.

10. The apparatus of claim 9 wherein said first material has an interior surface and said magnetic shield means comprises a second material attached to said interior surface of said first material, said second material adapted to substantially attenuate said electromagnetic fields created in said shell of said first material when said lightning strike communicates with said shell.

11. The apparatus of claim 10 wherein said second material is attached to said interior surface of said first material in spaced-apart relationship to create a space therebetween for receiving a thermal insulating material therein.

12. The apparatus of claim 10 further comprising a corrosion prevention means located between said first and second materials.

13. The apparatus of claim 12 wherein said first material is aluminum and said second material is an alloy comprising about forty to about eighty percent nickel.

14. The apparatus of claim 9 wherein said vent means further comprises at least one fan member corresponding to at least one vent means for drawing air into said building.

* * * * *